(12) United States Patent
Lerner et al.

(10) Patent No.: US 6,718,503 B1
(45) Date of Patent: Apr. 6, 2004

(54) REDUCED LATENCY INTERLEAVER UTILIZING SHORTENED FIRST CODEWORD

(75) Inventors: Gregory Lerner, Beer Sheva (IL); Dan Raphaeli, Kfar Saba (IL); Oren Kaufman, Beer Sheva (IL); Boris Zarud, Beer Sheva (IL)

(73) Assignee: Itran Communications Ltd., Beersheva (IL)

( * ) Notice: Subject to any disclaimer, the term of this patent is extended or adjusted under 35 U.S.C. 154(b) by 95 days.

(21) Appl. No.: 10/035,118

(22) Filed: Jan. 4, 2002

(51) Int. Cl.[7] .............................................. H03M 13/00
(52) U.S. Cl. ...................... 714/755; 714/762
(58) Field of Search ................. 714/755, 762, 714/792, 746, 756, 799, 752; 360/40; 341/81

(56) References Cited

U.S. PATENT DOCUMENTS

| | | | |
|---|---|---|---|
| 5,563,887 A | | 10/1996 | Harasaki ...................... 714/756 |
| 5,841,378 A | * | 11/1998 | Klayman et al. ............. 341/61 |
| 5,898,698 A | | 4/1999 | Bross ........................ 714/701 |
| 5,928,371 A | * | 7/1999 | Robinson et al. ........... 714/702 |
| 6,014,411 A | * | 1/2000 | Wang ........................ 375/259 |
| 6,035,427 A | | 3/2000 | Kweon ........................ 714/702 |
| 6,064,695 A | | 5/2000 | Raphaeli ..................... 375/230 |
| 6,285,681 B1 | * | 9/2001 | Kolze et al. ................ 370/442 |
| 6,311,306 B1 | * | 10/2001 | White et al. ................ 714/790 |
| 6,405,338 B1 | * | 6/2002 | Sinha et al. ................ 714/752 |
| 6,453,439 B1 | * | 9/2002 | Hattori et al. ............. 714/755 |
| 6,522,704 B1 | * | 2/2003 | Hatakeyama ............... 375/340 |

OTHER PUBLICATIONS

US application 09/883,589, Filed Jun. 18, 2001, "Channel Access Method for Powerline Carrier Based Media Access Control Protocol", Raphaeli et al.

* cited by examiner

Primary Examiner—Phung M. Chung
Assistant Examiner—Mujtaba Chaudry
(74) Attorney, Agent, or Firm—Howard Zaretsky

(57) ABSTRACT

A interleaver/de-interleaver mechanism for reducing the latency of transmitted interleaved codewords. The interleaver/de-interleaver mechanism utilizes a shortened first codeword which functions to offset the interleaving and transmission on subsequent codewords so as to achieve reduced latency depending on the degree of shortening applied. The interleaver/de-interleaver mechanism is particularly useful in power line carrier based systems to reduce the exposure to burst errors by providing interleaving with minimal latency penalty.

44 Claims, 8 Drawing Sheets

REDUCED LATENCY INTERLEAVER UTILIZING SHORTENED FIRST CODEWORD

FIELD OF THE INVENTION

The present invention relates generally to data communication systems and more particularly relates to a reduced latency interleaver/de-interleaver system adapted to utilize a shortened first codeword.

BACKGROUND OF THE INVENTION

Digital data communications systems are currently being used more and more to transmit and receive data between remote locations. The reliability and integrity of the data being communicated is an important part of any data communications system. In the ideal case, the data being transmitted should be identical to the data being received at the receiving location. In reality, however the data received at the receiving location is oftentimes corrupted with respect to the original data transmitted. Any data communication errors arc usually attributed to one or more of the transmission equipment, transmission medium or receiving equipment. With respect to the transmission medium, these types of data errors are usually attributed to the less than ideal conditions associated with the particular transmission medium.

For example, communication systems designed to transmit and receive using power line carrier techniques are subjected to the non-optimum conditions imposed by the power line medium. The power line medium is an unstable medium characterized by much pulse noise, continuous wave interference and impedance modulation. Depending on the length of the symbols used to transmit packets, the channel may not be assumed to be static during a packet time.

Consider a relatively long symbol time of 800 $\mu$sec. In this case, the power line channel cannot be assumed to be statistically static during a packet time. In cases such as this, some kind of error correcting code (ECC) is typically employed. Data communications systems often rely on error detection or error correction schemes to detect the occurrence of a data error or to correct a data error. As is known by practical tests, the most critical problem imposed by the power line that a modem must deal with is impedance modulation. The power line impedance modulation way be modeled as signal elimination at a 20% duty cycle periodically at a rate of 100 Hz for a 50 Hz AC line or 120 Hz for a 60 Hz AC line. Thus, any error correcting code employed must be robust enough to overcome this problem.

One simple form of error detection is the use of a parity bit associated with each block of data to indicate whether the particular block contains an odd or even number of '1' bits. This is a simple type of error detection scheme capable of accurately detecting only up to one bit error per data block. The use of a parity bit, however, cannot detect the occurrence of two bit errors in a data block, since this is not detected as a parity violation. Additionally, a single parity bit can only detect errors, it cannot correct any errors. When an error is detected, the receiver requests retransmission of the particular data block from the transmitter.

Another well known correction and/or detection scheme involves the use of binary block codes. Specifically, an (n, k, d) binary block code is a set of $2^k$ binary codewords of block length n and minimum coding distance d. The data to be transmitted is first partitioned into binary blocks of length k, then each block is mapped into a binary codeword of length n, which is then modulated and transmitted onto the channel. Such a block code is capable of correcting up to t=(d−1)/2 errors within each codeword.

The problem of burst errors may be overcome by the use of interleaving. Power line channel errors may occur in bursts, the length of which may exceed the error correction capability of the code. Interleaving the data stream before it is modulated and transmitted over the channel may help to overcome burst errors. An interleaver is a memory device used to rearrange and separate the codewords to be transmitted. Thus, if an error burst occurs during transmission of a packet, the error burst will not be localized to one particular codeword. Rather, the errors will be spread across several codewords. If the errors were completely within one codeword, they may exceed the number of errors that the system can correct by the use of a block code. By smearing the data errors across several codewords, the number of errors within each codeword will be reduced such that the ECC is capable of correcting the errors.

At the transmitter, the interleaver functions to rearrange the data within the codewords while at the receiver, the de-interleaver essentially performs the reverse process to reconstruct the codewords for subsequent use. This type of interleaving, referred to as block interleaving, introduces latency due to the fact that a complete block has to be written before it can be read.

A diagram illustrating the input and output data of an example prior art 2:1 block interleaver is shown in FIG. 1. In this example, codewords of length 9 symbols we input to an interleaves. Each codeword is made up of 7 data symbols and two parity symbols. The interleaver has a block size of 2 codewords. Thus, the interleaver input block buffer is filled with two codewords, gay referenced 10, which are then 2:1 interleaved. The output is shown by the symbol buffer 12. The symbols of the first codeword are denoted by the '1's and the symbols of the second codeword by the '2's. Each codeword also comprises two parity symbols denoted generally $P_n^k$ where k denotes the codeword number and n denotes the parity symbol number.

Without interleaving, the first codeword arrives at the receiver after one codeword time. Since no interleaving was used, the symbols received represent the complete codeword that can be immediately decoded. With the use of interleaving, receipt of the last symbol of the first codeword does not occur until the $17^{th}$ symbol, at which time it may be passed to the decoder. The last symbol of the second codeword arrives one symbol later. Thus, the first codeword suffers from latency of almost an entire codeword.

The latency caused by conventional interleavers may be problematic depending on the requirements of the particular communications system and the protocol(s) used therewith. For some systems, this latency is intolerable thus precluding the use of interleaving in the system.

There is thus a need for an interleaving scheme that is able to provide the benefits of interleaved transmission of data while reducing the latency of the system to a minimum or even eliminating it altogether.

SUMMARY OF THE INVENTION

The present invention is a novel and useful interleaver/de-interleaver mechanism for reducing the latency of transmitted interleaved codewords. The interleaver/de-interleaver mechanism utilizes a shortened first codeword which functions to offset the interleaving and transmission of subsequent codewords so as to achieve reduced latency depending on the degree of shortening applied. The mechanism of the present invention is useful in communication systems characterized by consecutively transmitted codewords made up of a plurality of symbols. The mechanism of the present invention is especially useful in communication systems that utilize the power line as the transmission medium. The interleaver/de-interleaver mechanism may be used in power line carrier based systems to reduce the exposure to burst errors by providing interleaving with minimal latency penalty.

The invention is operative to greatly reduce interleaver latency by the use of 'symmetric' interleaving whereby the first codeword is shortened thus permitting its availability at the receiver sooner than the normal latency of two codeword times. Depending on the modulation scheme employed, length of the codeword L and the degree of shortening, the first codeword may be available after only a single codeword time, thus exhibiting zero latency.

In operation, the interleaver is operative to shorten the first codeword by a certain amount U symbol The shortened first codeword is then interleaved with the second codeword. A portion of the third codeword is then interleaved with the latter portion of the second codeword. The interleaving process continues in this staggered fashion. The interleaved symbols generated are transmitted onto the channel.

At the receiver, the interleaved symbols are received and every block of L symbols is counted. After receipt of the first L symbols, the first shortened codeword can be de-interleaved and decoded. After receipt of the subsequent L symbols, the second codeword can be decoded. The shortened first codeword is reconstructed by assuming predetermined dummy symbols for the absent symbols. For example, the transmitter and receiver may be adapted to insert 'zero' symbols into the U absent symbol places. Thus, the decoder at the receiver is unaware of the use of the shortened first codeword. Subsequent codewords are de-interleaved and decoded normally.

Many aspects of the previously described invention may be constructed as software objects that execute in embedded devices as firmware, software objects that execute as part of a software application on a computer system running an operating system such as Windows, UNIX, LINUX, etc., an Application Specific Integrated Circuit (ASIC), Field Programmable Gate Array (FPGA) or functionally equivalent discrete hardware components.

There is therefore provided in accordance with the present invention a method of interleaving a stream of codewords, each codeword having a length L symbols, the method comprising the steps of interleaving the last L-U symbols of a first codeword with the first L-U symbols of a second codeword, interleaving the first U symbols of a third codeword with the last U symbols of the second codeword, shortening the initial first codeword received in the stream of codewords by skipping over the first U symbols of the initial first codeword and wherein L and U are positive integers.

There is also provided in accordance with the present invention an interleaver for interleaving a stream of codewords, each codeword having a length L symbols, the method comprising the steps of means for interleaving the last L-U symbols of a first codeword with the first L-U symbols of a second codeword, means for interleaving the first U symbols of a third codeword with the last U symbols of the second codeword, means for shortening the initial first codeword received in the stream of codewords by discarding the first U symbols of the initial first codeword and wherein L and U are positive integers.

There is further provided in accordance with the present invention a method of de-interleaving a stream of symbols, the method comprising the steps of sequentially counting each received symbol, upon receipt of the first L symbols, de-interleaving and extracting L-U symbols to construct a first shortened codeword and upon receipt of each subsequent L symbols, de-interleaving and extracting L symbols to construct subsequent codewords.

There is also provided in accordance with the present invention a de-interleaver for de-interleaving a stream of symbols, the method comprising the steps of means for sequentially counting each received symbol, means for de-interleaving the first L symbols and for extracting L-U symbols therefrom so as to construct a first shortened codeword and means for de-interleaving subsequent groups of L symbols and for extracting L symbols from the previously received group of 2L symbols so as to construct subsequent codewords.

There is further provided in accordance with the present invention a modem transceiver for transmitting and receiving signals in a communications media based network comprising a coupling circuit for generating a receive signal received over the network and for outputting a transmit signal onto the network, a transmitter adapted to modulate data to be transmitted in accordance with a modulation scheme so as to generate a transmit waveform therefrom, the transmitter comprising an interleaver for interleaving a stream of codewords, each codeword having a length L symbols, the interleaver comprising means for interleaving the last L-U symbols of a first codeword with the first L-U symbols of a second codeword, means for interleaving the first U symbols of a third codeword with the last U symbols of the second codeword, means for shortening the initial first codeword received in the stream of codewords by discarding the first U symbols of the initial first cod wherein L and U are positive integers, a receiver adapted to demodulate the receive signal in accordance with the modulation scheme so as to generate a receive data signal therefrom, the receive comprising a de-interleaver for de-interleaving a stream of symbols, the de-interleaver comprising means for sequentially counting each received symbol, means for de-interleaving the first L symbols and for extracting L-U symbols therefrom so as to construct a first shortened codeword, means for de-interleaving subsequent groups of L symbols and for extracting L symbols from the previously received group of 2L symbols so as to construct subsequent codewords, a media access control (MAC) circuit adapted to interface an application processor to the shared communications media, the application processor adapted to control the operation of the transmitter, receiver and MAC and to provide an interface between the MAC and an external host.

BRIEF DESCRIPTION OF THE DRAWINGS

The invention is herein described, by way of example only, with reference to the accompanying drawings, wherein.

DETAILED DESCRIPTION OF THE INVENTION

Notation Used Throughout

Figure 1:
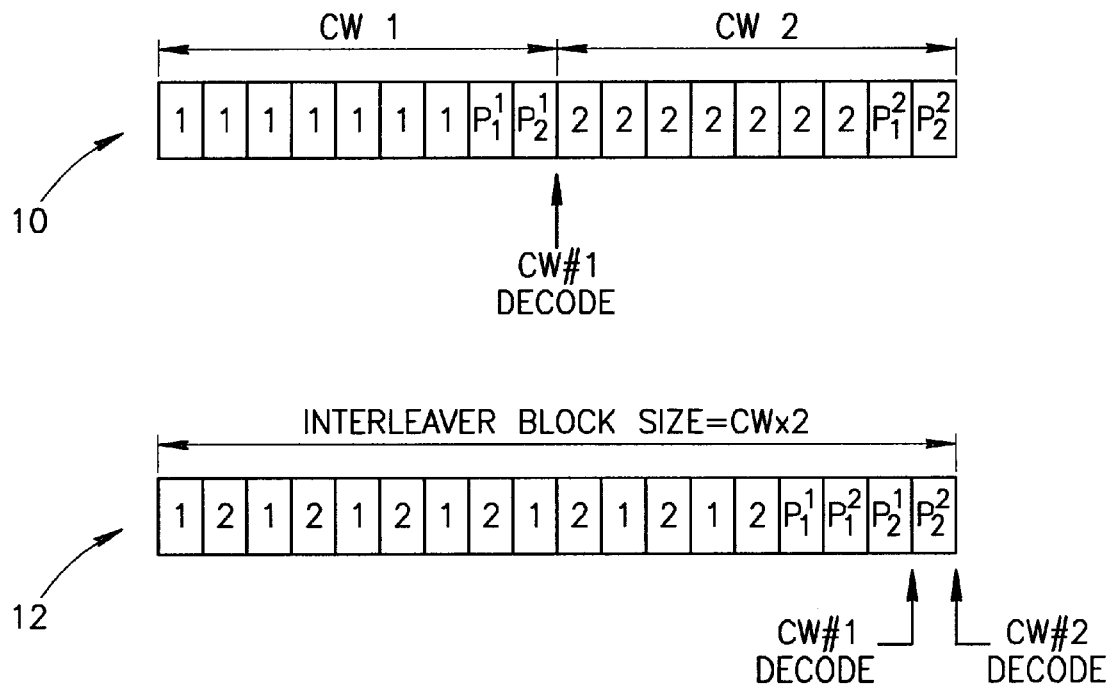
FIG. 1 is a diagram illustrating the input and output data of an example prior art 2:1 interleaver.

The following notation is used throughout this document.

| Term | Definition |
| --- | --- |
| ASIC | Application Specific Integrated Circuit |
| CRC | Cyclic Redundancy Code |
| CSK | Code Shift Keying |
| CW | Codeword |
| DCSK | Differential Code Shift Keying |
| ECC | Error Correcting Code |
| FPGA | Field Programmable Gate Array |
| IR | Infrared |
| LAN | Local Area Network |
| MAC | Media Access Control |
| MAN | Metropolitan Area Network |
| OSI | Open Systems Interconnect |
| PLC | Power Line Carrier |
| PN | Pseudo random Noise |
| RAM | Random Access Memory |
| RF | Radio Frequency |
| UST | Unit Symbol Time |
| WAN | Wide Area Network |

Detailed Description of the Invention

The present invention is a novel and useful interleaver/de-interleaver mechanism for reducing the latency of transmitted interleaved codewords. The interleaver/de-interleaver mechanism utilizes a shortened first codeword which functions to offset the interleaving and transmission of subsequent codewords so as to achieve reduced latency depending on the degree of shortening applied. The mechanism of the present invention is useful in communication systems characterized by consecutively transmitted codewords made up of a plurality of symbols. The mechanism of the present invention is especially useful in communication systems that utilize the power line as the transmission medium. The interleaver/de-interleaver mechanism may be used in power line carrier based systems to reduce the exposure to burst errors by providing interleaving with minimal latency penalty.

Throughout this document, the term 'station,' 'node' or 'communication node' shall be taken to mean any network entity, implemented in either hardware, software or a combination of hardware and software, which may be the endpoint of a call, link or connection within a shared media based network. The network may comprise any type of shared network or media including but not limited to power line carrier based networks, twisted pair networks, IR wireless networks, RF wireless networks, optical fiber ring networks, etc.

The term 'call,' 'link' or 'connection' shall be taken to mean any communication path that is established between at least two nodes for the purpose of communication therebetween.

The term 'transmit waveform' shall be taken to mean the spreading waveform modulated to convey information in accordance with the data to be transmitted. For example, the spreading waveform may comprise a chirp or PN sequence circularly shifted in accordance with the data.

The term 'symbol' is defined as a unit of information that is conveyed in a single transmit waveform. A symbol may represent one or more bits in accordance with the particular implementation.

The term 'codeword' is defined as a set of symbols comprising one or more data symbols and one or more corresponding encoded parity symbols which are generated via a data encoding process. The data and parity symbols together make up a codeword. Note that the term codeword as used in this document is meant to refer to an example communication scheme that encodes data into codewords for transmission over the channel. The invention is not to be limited to systems that use codewords to transmit information, as information may be transmitted without encoding. The interleaver of the present invention functions to interleave the symbols making up the codewords as described infra.

Note that throughout this document, parity symbols are denoted generally as $P_n^k$ where k denotes the codeword number and n denotes the parity symbol number. For example, $P_2^1$ denotes the second parity symbol of the first codeword.

An example application of the interleaver/de-interleaver mechanism of the present invention is with use in a spread spectrum data communications system that utilizes the Differential Code Shift Keying (DCSK) or non-differential Code Shift Keying (CSK) modulation technique. Such communications systems are applicable to relatively noisy environments such as the AC power line. To aid in illustrating the principles of the present invention, the interleaver/de-interleaver mechanism is described in the context of a near baseband spread spectrum communication system utilizing CSK modulation. Note that the invention is not limited to this modulation, as one skilled in the art can apply the interleaver/de-interleaver mechanism described herein to other types of communication systems and other types of modulation as well.

In a CSK transmission system, the data is transmitted in the form of time shifts between consecutive circularly rotated waveforms of length T which are referred to as spreading waveforms, i.e., spread spectrum correlator sequence waveforms. The spreading waveforms can comprise any type of waveform that has suitable auto correlation properties. During each symbol period, referred to as a unit symbol time (UST), a plurality of bits are transmitted. The symbol period is divided into a plurality of shift indexes with each shift index representing a particular bit pattern. The information, i.e., bit pattern, is conveyed by rotating the spreading waveform by a certain amount corresponding to the data to be transmitted. The data is conveyed in the degree of rotation or circular shift applied to the spreading waveform before it is transmitted. Note that the spreading waveform may comprise any suitable waveform such as a chirp, pseudorandom sequence, etc.

In a CSK system, the data is conveyed in the absolute shift assigned to the spreading waveform. In a DCSK system, the data is conveyed in the shift differential between consecutive symbols. The interleaver/de-interleaver scheme of the present invention is applicable to both CSK and DCSK transmission systems.

Upon reception by the receiver, the signal is input to a matched filter having a template of the spreading waveform pattern to detect the amount of rotation (or circular shift) within the received signal for each symbol. The received data is fed into a cyclic correlator wherein the contents are periodically circularly shifted and a correlation output generated therefrom. Cyclic correlation may be achieved by inputting the received data to a shift register whose output is fed back to its input and circularly rotating, i.e., shifting, the contents of the shift register. The output of the shift register is input to a matched filter. For each bit shift or rotation, the matched filter generates a correlation sum. A shift index is determined for each UST corresponding to the shift index that yields the maximum (or minimum) correlation sum. Differential shift indexes are generated by subtracting the currently received shift index from the previously received shift index. The differential shift index is then decoded to yield the originally transmitted data.

Spread spectrum communications systems based on DCSK or CSK modulation are described in more detail in U.S. Pat. No. 6,064,695, to Raphaeli, entitled "Spread Spectrum Communication System Utilizing Differential Code Shift Keying," incorporated herein by reference in its entirety. Note, however, that one skilled in the communication arts may apply the techniques of the present invention to other modulation techniques as well.

Figure 2:
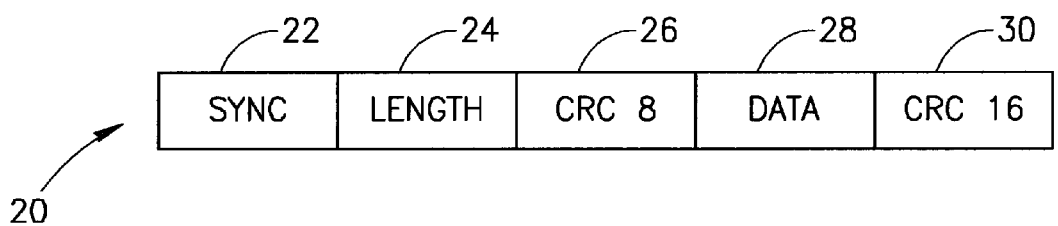
FIG. 2 is a diagram of an example packet format presented to aid in illustrating the operation of the present invention.

A diagram of an example packet format presented to aid in illuming the operation of the interleaver mechanism of the present invention is shown in FIG. 2. The packet, generally referenced 20, comprises the following fields. The synchronization sequence field 22 is a unique pattern known to both sides and used by the receiver to synchronize the reception of the packet. The length field 24 is the packet header field that in his example is one byte that includes the data configuration and the packet length. The CRC8 field 26 is an 8-bit cyclic redundancy check on the packet header field. The data payload field 28 comprises one or more data bytes and the CRC16 field 30 is a 16-bit CRC check on the payload portion of the packet.

As described above, the use of an interleaver in a communications system can improve performance in the presence of burst errors. In power line carrier applications, the interleaver block length is preferably chosen to be at least as long as half the period of the AC power. At the beginning of transmission of a packet, the receiver will attempt to lock onto the signal. If the receiver enters a false lock situation, both transmitting and receiving functions are temporally suspended until the packet header is decoded. Transmission and reception do not resume until the first codeword is completely received and decoded. More specifically, the packet header and CRC8 fields are the only ones required. In the case of a prior art conventional interleaver, the receiver must wait two codeword times until the first codeword is available.

In accordance with the present invention, however, interleaver latency is greatly reduced by the use of 'symmetric' interleaving whereby the first codeword is shortened thus permitting its availability much quicker then two codeword times. Depending on the length of the codeword and the degree of shortening, the first codeword may be available after only a single codeword time, i.e. no latency at all.

Figure 3:
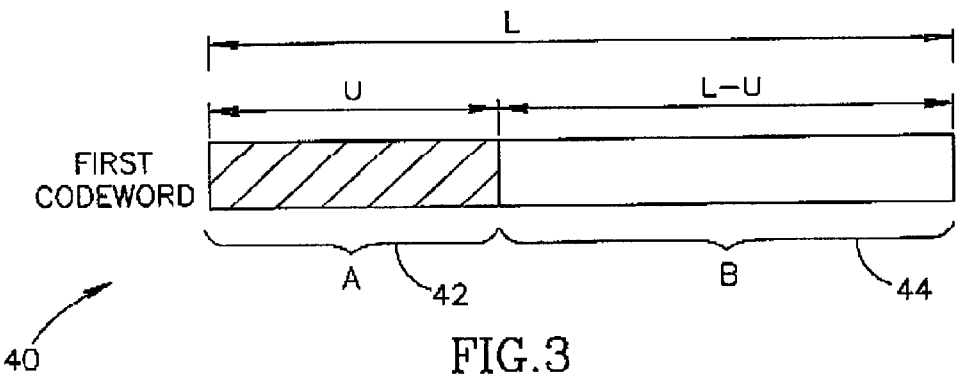
FIG. 3 is a diagram illustrating the partitioning of the first U symbols of the first and subsequent codewords in accordance with the present invention.

A diagram illustrating the partitioning of the first U symbols of the first and subsequent codewords in accordance with the present invention is shown in FIG. 3. The interleaver is adapted to split the first and a portion of subsequent codewords into two portions. The first codeword, generally referenced 40, is split into an A portion 42 of length U and a B portion 44 of length L-U where L is the length of a complete codeword. It is assumed that the units of L and U are symbols, but may be bits, bytes, etc. depending on the implementation. The hatched portion A of the first codeword indicates that it is ignored, i.e. skipped over, by the interleaver.

Figure 4:
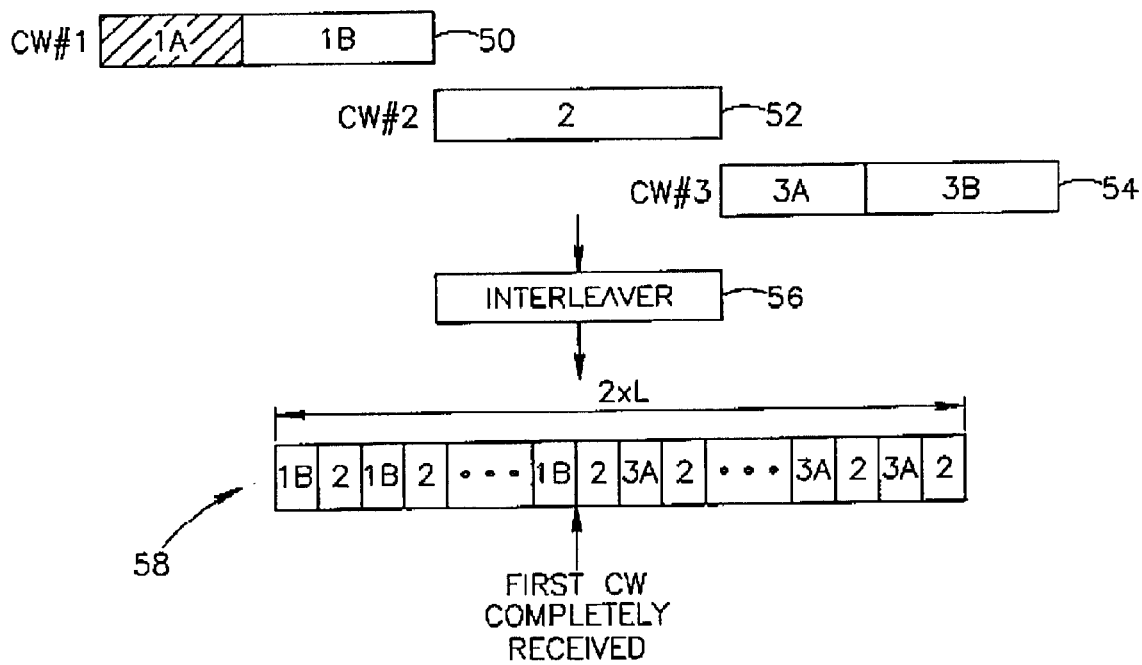
FIG. 4 is a diagram illustrating the operation of the interleaver of the present invention including input and output data.

A digram illustrating the operation of the interleaver of the present invention including input and output data is shown in FIG. 4. The first three codewords CW #1 50, CW #2 52 and CW #3 54 are shown with the first codeword divided into parts 1A and 1B and the third codeword divided into parts 3A and 3B. The codewords are then interleaver by interleaver 56 and the output 58 is shown. As indicated, the 1B and 3A park of CW #1 and CW #3, respectively, are interleaved with the complete contents of CW #2. Due to the shortened first codeword, the last symbol of the first codeword arrives much sooner than two codeword times. In one example provided herein, it arrives after one-codeword delay.

Figure 5:
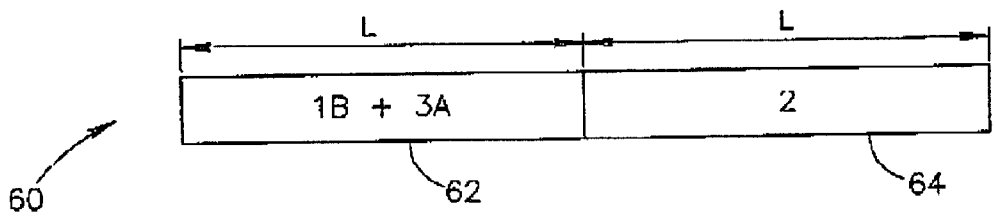
FIG. 5 is a diagram illustrating the rearrangement of symbols in the input codeword stream to form the interleaver input block.

A diagram illustrating the rearrangement of symbols in the input codeword stream to form the interleaver input block is shown in FIG. 5. The first, second and third codewords are divided so as to place the 1B and 3A portions in the position of the first codeword 62 and the complete second codeword in the position of the second codeword 64. The assembled interleaver input block 60 is then processed to yield the interleaved output shown in FIG. 4.

As described hereinabove, when the receiver enters a false lock situation, both transmitting and receiving functions ore temporarily suspended until the packet header is decoded. The information needed comprises the packet header and CRC8 fields. These fields together comprise 16 bits. The number of symbols needed to represent these two fields and thus the degree of shortening possible for the first codeword varies depending on the modulation and encoding scheme used. For example, in the case of DCSK6 modulation, a type of Code Shift Keying modulation, each symbol represents 6-bits. Thus, three symbols are required to convey the two fields. Furthermore, encoding of the data to generate horizontal and diagonal parity symbols, yields codewords comprising 7 data symbols and 2 parity symbols for a total of nine symbols. Since only three symbols are required, four symbols can be omitted from the first codeword. Thus, the first codeword can be shortened to 5 symbols.

At the receiver, the first codeword is received and passed to the decoder much sooner than would be possible if a whole codeword was transmitted. For the first codeword only, the decoder is adapted to assume predetermined symbols for the symbols that were skipped at the transmitter. For example, the zero symbol (i.e. symbol representing the 6-bit value 0b000000) can be assumed in each of the four absent symbol places. Thus, the transmission and interleaving of a shortened codeword for the first codeword is transparent to the decoder.

At the receiver, the decoding process begins only after receipt of the symbols constituting the first codeword. The decoder is adapted to assume that the first codeword comprises (L−1)/2 'zero' symbols. Note that this expression is valid only for the DCSK6 example presented above. Note also that symbols other than the zero symbol may be used to fill the places of the absent symbols depending on the implementation without departing from the scope of the invention. Whatever symbol is chosen, the encoder in the transmitter and decoder in the receiver must have knowledge of the symbol used.

In one embodiment, the decoder takes into account the (L−1)/2 'zero' symbols in calculating the metric values for the first codeword. Depending on the implementation, the correlation and maximum (i.e. hard decision) RAM memory tables in the decoder are filled with 'zero' data in the correct locations so that it appears as if zeros were received in the first four symbols.

Figure 6A:
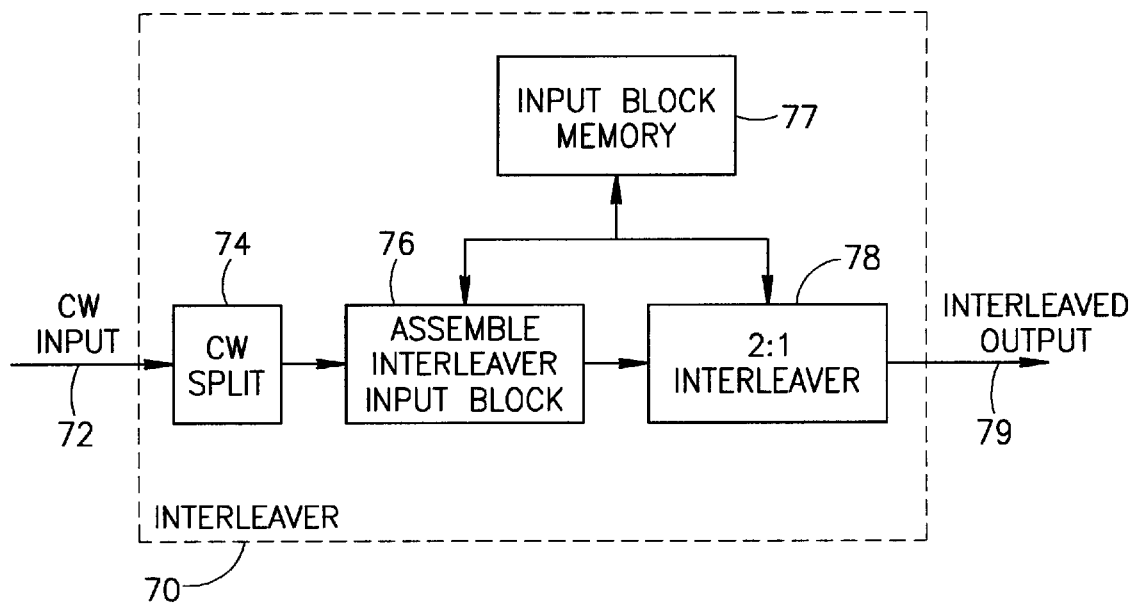
FIG. 6A is a block diagram illustrating an interleaver constructed in accordance with the present invention.

A block diagram illustrating an interleaver constructed in accordance with the present invention is shown in FIG. 6A. The example embodiment of the interleaver, generally referenced 70, comprises a codeword splitter 74 that functions to divide the input codewords 72 into two portions. In the DCSK6 example, each odd codeword is split into two 4 and 5 symbol portions. The two portions are placed in the input block memory 77 by the assembler 76 in accordance with the present invention. Once the input block memory is full, a 2:1 interleaver 78 generates the interleaved output 79. In accordance with the invention, the assembler is adapted to discard (i.e. skip over or ignore) the first U symbols of the first codeword.

Figure 6B:
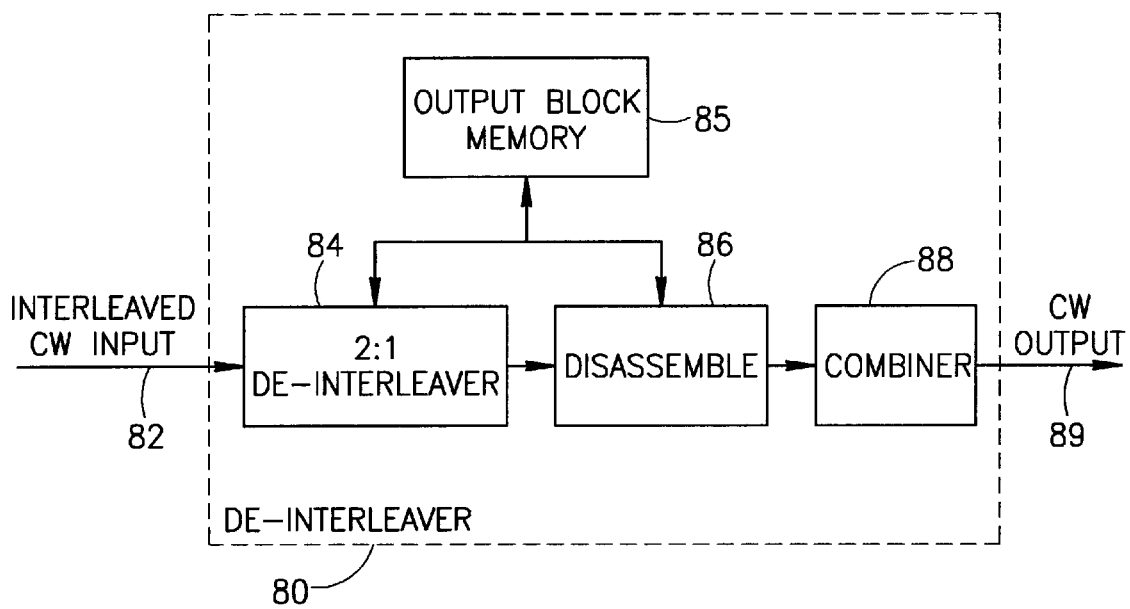
FIG. 6B is a block diagram illustrating a de-interleaver constructed in accordance with the present invention.

A block diagram illustrating a de-interleaver constructed in accordance with the present invention is shown in FIG. 6B. At the receiver, the de-interleaver, generally referenced 80, functions to receive interleaved symbols 82 from the channel and first to de-interleave them via de-interleaver 84. The de-interleaved output is placed in the output block memory 85 the contents of which are then disassembled 86. During the disassemble process the groups of symbols from different codewords are separated from each other. The combiner 88 functions to reunite the portions of codewords to generate complete codewords 89 which are then passed to the decoder. In accordance with the invention, the shortened first codeword is made whole by filling the absent symbols with predetermined symbol data. Depending on the implementation, this function may be performed by the de-interleaver or by the decoder.

Figure 7A:
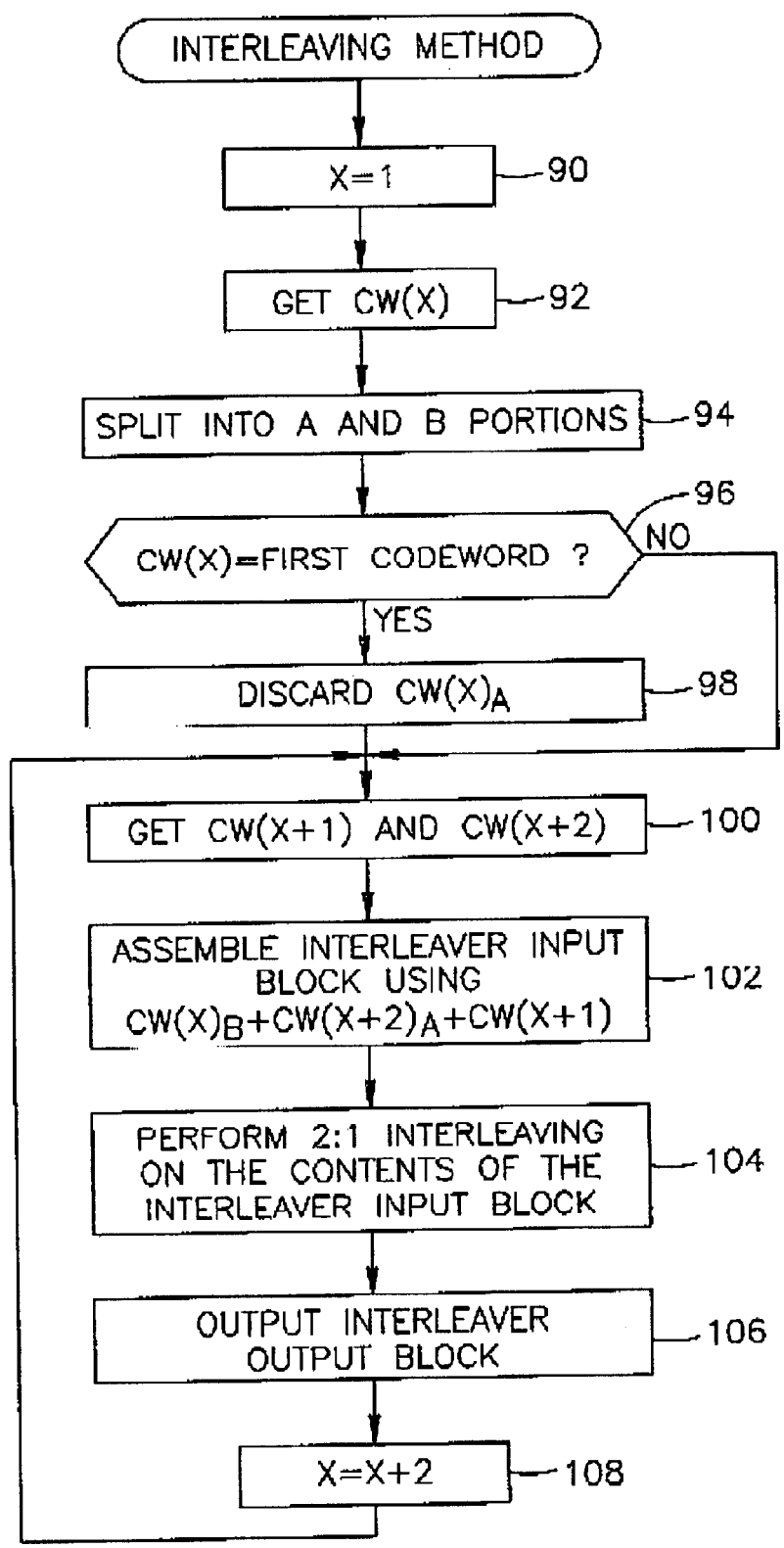
FIG. 7A is a flow diagram illustrating the interleaver method of the present invention.

A flow diagram illustrating the interleaver method of the present invention is shown in FIG. 7A. The method described herein is one example of performing the mechanism of the present invention. The mechanism is suitable for implementation in hardware (e.g., ASIC, FPGA, etc.), software or a combination of both. The method receives codewords, splits them, assembles the input block and performs the interleaving function. The variable 'x' is used as an index representing the stream of input codewords.

The index 'x' is initialized to the value one (step 90). The next codeword CW(x) is retrieved (step 92). The receive codeword is split into two portions: one of length U symbols (A portion) and the other L−U symbols (B portion) where L represents the length of the codeword. If the codeword received is the very first codeword in the packet (step 96), the A portion denoted $CW(X)_A$ is ignored (i.e. skipped or discarded) in order to shorten the first codeword so as to reduce the latency of the decoding of the first codeword at the receiver (step 98).

The next two codewords CW(x+1) and CW(x+2) are then retrieved and the latter split into A and B portions (step 100). The interleaver input block is then assembled using the following:

$$CW(X)_B + CW(x+2)_A + CW(x+1) \qquad \text{(step 102)}$$

Interleaving is then performed on the contents of the input block (step 104). The interleaved symbols are then transmitted onto the channel (step 106). The codeword index 'x' is incremented by two (step 108) and the process is repeated with the fetching of the next two codewords (step 100).

Figure 7B:
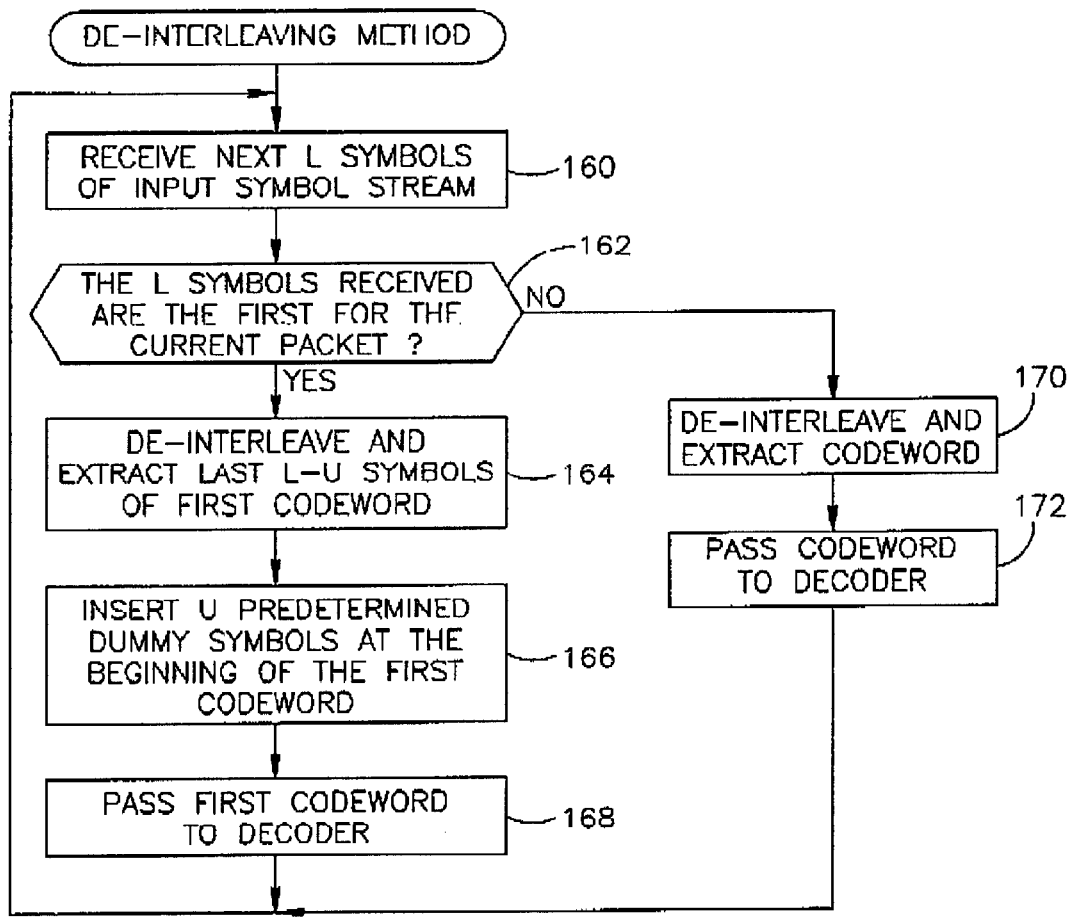
FIG. 7B is a flow diagram illustrating the de-interleaver method of the present invention.

A flow diagram illustrating the de-interleaver method of the present invention is shown in FIG. 7B. At the receiver, the interleaved symbols are received and counted until L symbols are received (step 160). If the L symbols received are the first for the current packet (step 162), the L-U symbols of the shortened codeword are de-interleaved and extracted from the input symbol stream (step 164). 'U' predetermined dummy symbols are inserted at the beginning of the first codeword to restore it to the complete length L (step 166). The dummy symbols inserted may comprise any symbol that is known to both transmitter and receiver. For example, the 'zero' symbol may be used. In the case of spread spectrum modulation, the correlation and hard decision (i.e. maximum) memory tables are written with predefined data to mimic reception of a 'zero' symbol. Once the codeword is reconstructed, it is passed to the decoder (step 168).

If the L symbols received are not the first for the current packet (step 162), than the symbols making up the next codeword are de-interleaved and extracted (step 170). The resulting codeword is then passed to the decoder (step 172). After the first codeword, all the symbols for the second codeword arrive after two codeword times. Thus, after every codeword time, the next codeword becomes available for decoding.

Figure 8:
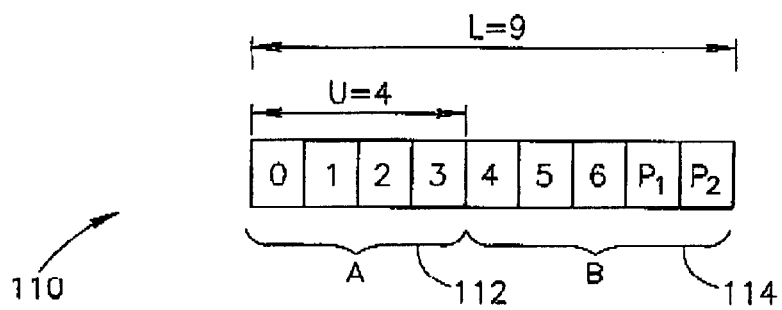
FIG. 8 is a diagram illustrating an example codeword nine symbols long wherein the first four symbols of the first codeword are not transmitted.

The following example illustrates the operation of the present invention. A diagram illustrating an example codeword nine symbols long wherein the first four symbols of the first codeword are not transmitted is shown in FIG. 8. The codeword, generally referenced 110, comprises a total of L=9 symbols, wherein the A portion 112 is four symbols long and the B portion 114 is five symbols long. Thus, the first four symbols are skipped in order to form a first codeword having a length of five symbols.

Figure 9:
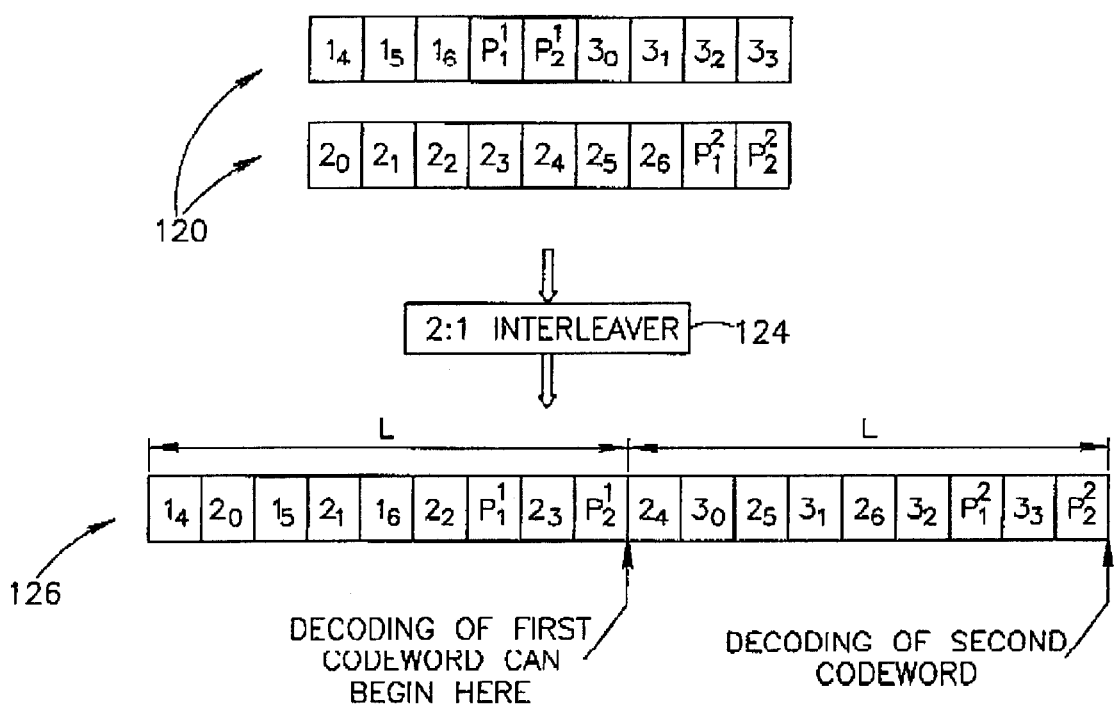
FIG. 9 is a diagram illustrating an example of the operation of the interleaver of the present invention using codewords having a length of nine symbols.

A diagram illustrating an example of the operation of the interleaver of the present invention using codewords having a length of nine symbols is shown in FIG. 9. In this example, the interleaver input block 120 is filled from L-U symbols of the shortened first codeword, L symbols of the second codeword and U symbols of the third codeword. The symbols of each codeword placed in the input block are indicated by the subscript. Each codeword also comprises two parity symbols denoted generally $P_n^k$ where k denotes the codeword number and n denotes the parity symbol number. The input block is interleaved via interleaver 124 and the results placed in an output block 126. The output block has a length 2L. Note that the first codeword is received and available for decoding after receipt of L symbols, thus reducing the latency to zero. The second codeword is available for decoding after the next L symbol times as indicated by the vertical arrow.

Figure 10:
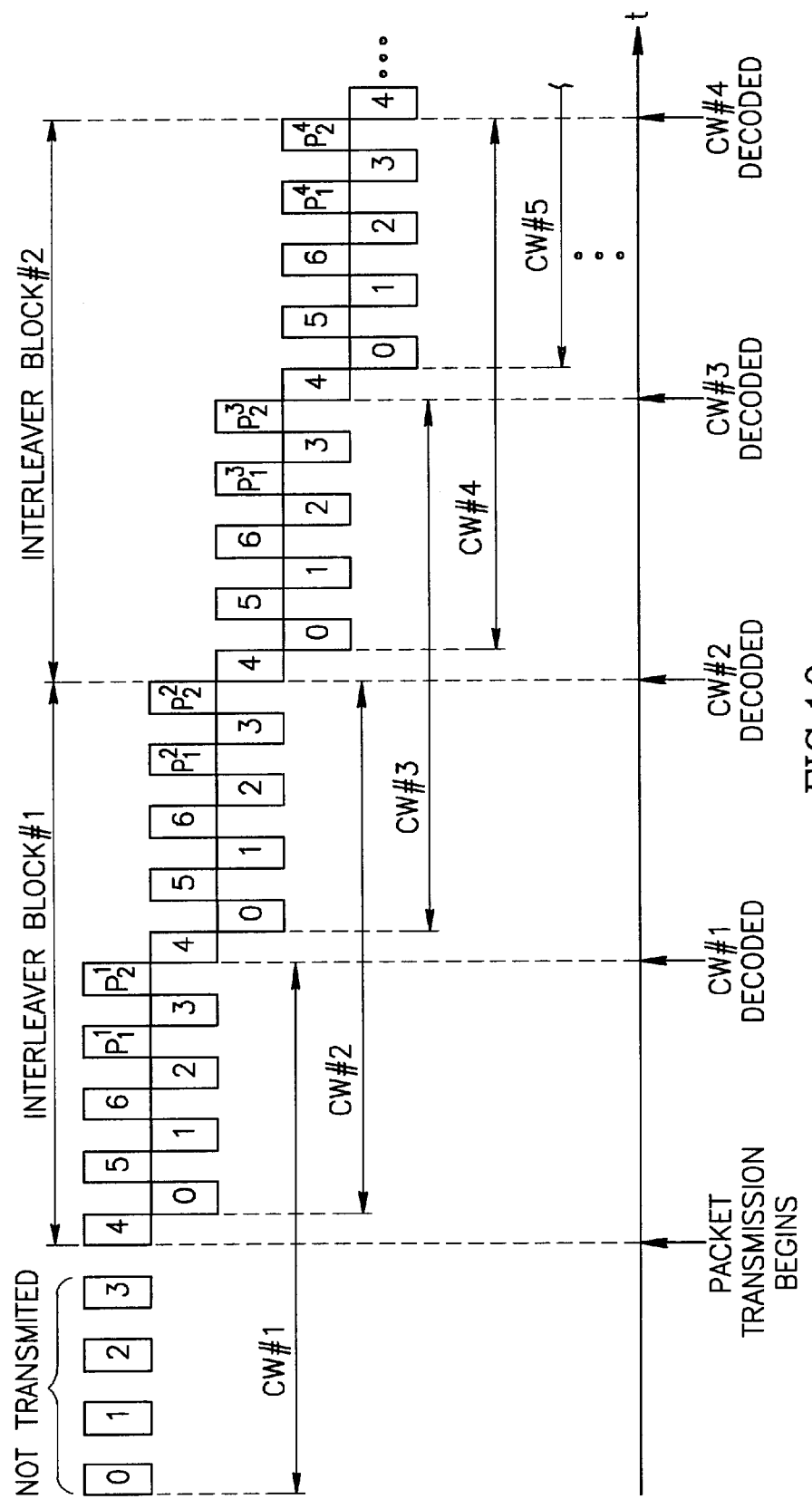
FIG. 10 is a diagram illustrating an example of the interleaved output stream generated by the interleaver of the present invention.

A diagram illustrating an example of the interleaved output stream generated by the interleaver of the present invention is shown in FIG. 10. This diagram is provided to highlight the interleaving of the symbols making up the codewords, the timing of their transmission onto the channel and the point in time at the receiver each codeword is available for decoding. In accordance with the present invention, the first U symbols (e.g., four) of the first codeword only are skipped over and ignored. Packet transmission begins with the fifth symbol of the first codeword. The L-U symbols of the first codeword are interleaved with the first L-U symbols of the second codeword. Due to the use of the shortened codeword, the first codeword can be decoded at the receiver after only a single codeword delay, i.e. after receipt of parity symbol $P_2^1$.

The first U symbols of the third codeword are then interleaved with the last U symbols of the second codeword. Upon receipt of the last parity symbol $P_2^2$, the second codeword may be decoded. The L-U symbols of the third codeword are then interleaved with the L-U symbols of the fourth codeword. The process continues in this fashion with the staggered interleaving of subsequent codewords. After receipt of the last parity symbol $P_2^3$ at the receiver, the third codeword may be decoded. Thus, in the case of a (9, 7) codeword, the interleaver of the present invention does not impose a latency penalty.

As another example, consider a codeword of (7, 5) representing a codeword comprising five data symbols and two parity symbols (L=7). Consider also the use of DCSK4 modulation wherein each symbols represents 4-bits. The 16-bits of packet header and CRC8 require four data symbols. Thus, in this example, only one data symbol can be ignored. Thus, the value of U in this case is 1 and L-U=6. The first codeword is shortened to six symbols and is interleaved with seven symbols of the second codeword and one symbol of the third codeword. At the receiver, the first codeword is available for decoding only after receipt of the eleventh symbol. The second codeword is available for decoding after receipt of the subsequent three symbols. This process repeats wherein the third codeword is available after the following eleven symbols with the fourth codeword available three symbols later.

In this DCSK4 example, the latency of the first codeword is reduced somewhat from two codeword times, but is relatively more than that achieved in the DCSK6 example presented hereinabove. More specifically, the latency in the DCSK4 case is reduced by two symbol times over the latency of conventional 2:1 interleaving.

Station Incorporating the Interleaver/De-interleaver Mechanism

The interleaver/de-interleaver mechanism of the present invention may be incorporated in a communications transceiver such as a station, network node, modem, transceiver, etc. One example application is in a digital modem adapted for communications over the power line medium using a near baseband spread spectrum-modulated signal that is coherently decoded. The modem utilizes a 120–400 kHz band (for use in the United States) or 20–80 kHz and 95–125 kHz band (for use in Europe). The modulation used is so called CSK or DCSK and the modem is capable of unicast, broadcast and multicast transmissions using the spread spectrum modulated signal in the appropriate band. The transmission protocol is packet oriented whereby each packet transmitted comprises some type of header including a synchronization sequence which permits the receiver to synchronize on the spreading waveform (e.g., chirp, PN sequence, etc.) followed by the packet data modulated as circularly shifted spreading waveforms. The synchronization sequence is processed through a linear correlator while the data is decoded using cyclic correlation.

Figure 11:
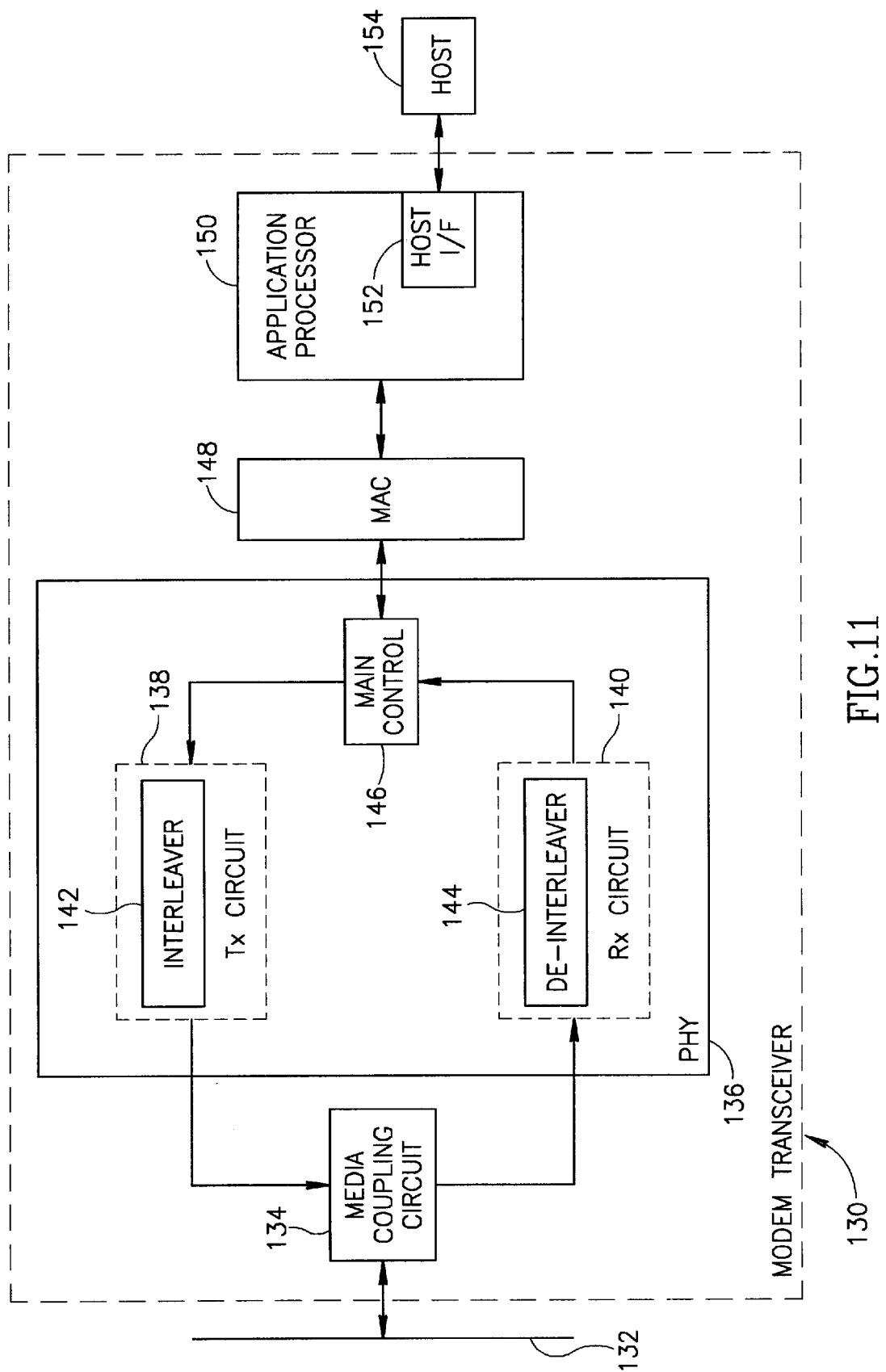
FIG. 11 is a block diagram illustrating an example embodiment of a station incorporating transmitter/receiver circuits comprising the interleaver/de-interleaver, respectively, of the present invention.

A block diagram illustrating an example embodiment of a modem incorporating transmitter and receiver circuits adapted to perform the interleaver/de-interleaver mechanism of the present invention is shown in FIG. 11. The modem, generally referenced 130, represents a modem that may operate on a stand alone basis or may be incorporated within a network device such as a switch, router, hub, broadband modem, cable modem, PLC based modem, etc. for performing communication functions (i.e. implementing OSI stack protocol functions including MAC functionality). The modem comprises an application processor 150 with associated static, dynamic, volatile and/or non-volatile memory (not shown) in communication therewith. The application processor is also in communication, via a host interface 152, with a host device 154. The host may be adapted to communicate over one or more networks, e.g., LAN, WAN, MAN, etc.

The station comprises media coupling circuitry 134 for interfacing the modem via the PHY circuit 136 to the shared medium 132 which may comprise the power line. The PHY circuit comprises a main control 146, transmit circuit 138 and receive circuit 140. The transmit circuit and receive circuit communicate over the medium via the media coupling circuitry.

In the transmit direction, the main control functions to accept data from the MAC for transmission and to forward it to the transmit circuit. The transmit circuit receives data for transmission from the main control and functions to encode the data into symbols which are then modulated and transmitted over the medium. The transmit circuit comprises interleaver 142 adapted to perform the interleaver mechanism of the present invention as described in detail supra.

In the receive direction, the receive circuit in the PHY functions to demodulate, correlate and decode the received signal from the media coupling circuit and to generate received output data therefrom. The receive circuit incorporates a de-interleaver 144 adapted to perform the de-interleaver mechanism of the present invention as described in detail supra. The received output data is forwarded to the MAC via the main control.

The media access controller (MAC) 148 functions, on one side, to output transmit data to the transmit circuit and to input receive data from the receive circuit. On the processor side, it interfaces to the application processor. The MAC is adapted to implement any suitable layer 2 (i.e. data link layer) media access control technique well known in the art. A MAC suitable for use with the present invention is described in U.S. patent application Ser. No. 09/883,589, filed Jun. 18, 2001, entitled "Channel Access Method for Powerline Carrier Based Media Access Control Protocol," similarly assigned and incorporated herein by reference in its entirety.

It is intended that the appended claims cover all such features and advantages of the invention that fall within the spirit and scope of the present invention. As numerous modifications and changes will readily occur to those skilled in the art, it is intended that the invention not be limited to the limited number of embodiments described herein. Accordingly, it will be appreciated that all suitable variations, modifications and equivalents may be resorted to, falling within the spirit and scope of the present invention.

What is claimed is:

1. A method of interleaving a stream of codewords, each codeword having a length L symbols, said method comprising the steps of:
   interleaving the last L-U symbols of a first codeword with the first L-U symbols of a second codeword;
   interleaving the first U symbols of a third codeword with the last U symbols of said second codeword;
   shortening the initial first codeword received in said stream of codewords by skipping over the first U symbols of said initial first codeword; and
   wherein L and U are positive integers.

2. The method according to claim 1, wherein said codeword length L is equal to 9 and comprises 7 data symbols and 2 parity symbols.

3. The method according to claim 1, wherein U is equal to 4 data symbols.

4. The method according to claim 1, wherein said codeword length L is equal to 7 and comprises 5 data symbols and 2 parity symbols.

5. The method according to claim 1, wherein U is equal to 1 data symbol.

6. The method according to claim 1, wherein said method is implemented in an Application Specific Integrated Circuit (ASIC).

7. The method according to claim 1, wherein said method is implemented in a Field Programmable Gate Array (FPGA).

8. An interleaver for interleaving a stream of codewords, each codeword having a length L symbols, said method comprising the steps of:
   means for dividing a beginning codeword into a fist portion and a second portion;
   means for dividing an ending codeword into a first portion and a second portion;
   means for interleaving said second part of said beginning codeword and said first part of said ending codeword with one or more intermediate codewords; and
   means for skipping the first portion of an initial codeword received in said stream of codewords.

9. The interleaver according to claim 8, wherein said means for interleaving comprises a 2:1 interleaver.

10. The interleaver according to claim 8, wherein said codeword comprises 7 data symbols and 2 parity symbols.

11. The interleaver according to claim 8, wherein said codeword comprises 5 data symbols and 2 parity symbols.

12. The interleaver according to claim 8, wherein said first portion of said beginning codeword and of said ending codeword comprises 4 data symbols.

13. The interleaver according to claim 8, wherein said first portion of said beginning codeword and of said ending codeword comprises 1 data symbol.

14. The interleaver according to claim 8, wherein said second portion of said beginning codeword and of said ending codeword comprises 3 data symbols and 2 parity symbols.

15. The interleaver according to claim 8, wherein said second portion of said beginning codeword and of said ending codeword comprises 4 data symbol and 2 parity symbols.

16. The method according to claim 8, wherein said method is implemented in an Application Specific Integrated Circuit (ASIC).

17. The method according to claim 8, wherein said method is implemented in a Field Programmable Gate Array (FPGA).

18. An interleaver for interleaving a stream of codewords, each codeword having a length L symbols, said method comprising the steps of:
   means for interleaving the last L-U symbols of a first codeword with the first L-U symbols of a second codeword;
   means for interleaving the first U symbols of a third codeword with the last U symbols of said second codeword;
   means for shortening the initial first codeword received in said stream of codewords by discarding the first U symbols of said initial first codeword; and
   wherein L and U are positive integers.

19. The interleaver according to claim 18, wherein said codeword length L is equal to 9 and comprises 7 data symbols and 2 parity symbols.

20. The interleaver according to claim 18, wherein U is equal to 4.

21. The interleaver according to claim 18, wherein said codeword length L is equal to 7 and comprises 5 data symbols and 2 parity symbols.

22. The interleaver according to claim 18, wherein U is equal to 1.

23. The interleaver according to claim 18 adapted to be implemented in an Application Specific Integrated Circuit (ASIC).

24. The interleaver according to claim 18 adapted to be implemented in a Field Programmable Gate Array (FPGA).

25. A method of de-interleaving a stream of symbols, said method comprising the steps of:
   sequentially counting each received symbol;
   upon receipt of the first L symbols, de-interleaving and extracting L-U symbols to construct a first shortened codeword: and
   upon receipt of each subsequent L symbols, de-interleaving and extracting L symbols to construct subsequent codewords.

26. The method according to claim 25, further comprising the step of inserting predetermined dummy symbols to the being of said first shortened codeword to yield an L symbol fist codeword.

27. The method according to claim 26, fiber comprising decoding said L symbol first codeword so as to yield packet header information and Cyclic Redundancy Code (CRC) information corresponding thereto.

28. The method according to claim 25, wherein said codeword length L is equal to 9 and comprises 7 data symbols and 2 parity symbols.

29. The method according to claim 25 wherein U is equal to 4 data symbols.

30. The method according to claim 25, wherein said codeword length L is equal to 7 and comprises 5 data symbols and 2 parity symbols.

31. The method according to claim 25, wherein U is equal to 1 data symbol.

32. The method according to claim 25, wherein said method is implemented in an Application Specific Integrated Circuit (ASIC).

33. The method according to claim 25, wherein said method is implemented in a Field Programmable Gate Array (FPGA).

34. A de-interleaver for de-interleaving a stream of symbols, said method comprising the steps of:
   means for sequentially counting each received symbol;
   means for de-interleaving the first L symbols and for extracting L-U symbols therefrom so as to construct a first shortened codeword; and means for de-interleaving subsequent groups of L symbols and for extracting L symbols from the previously received group of 2L symbols so as to construct subsequent codewords.

35. The de-interleaver according to claim 34 adapted to be implemented in an Application Specific Integrated Circuit (ASIC).

36. The de-interleaver according to claim 34 adapted to be implemented in a Field Programmable Gate Array (FPGA).

37. A modem transceiver for transmitting and receiving signals a shared communications media based network, comprising:

a coupling circuit for generating a receive signal received over said network and for outputting a transmit signal onto said network;

a transmitter adapted to modulate data to be transmitted in accordance with a modulation scheme so as to generate a transmit waveform therefrom, said transmitter comprising an interleaver for interleaving a stream of codewords, each codeword having a length L symbols, said interleaver comprising:

means for interleaving the last L-U symbols of a first codeword wit the first L-U symbols of a second codeword;

means for interleaving the first U symbols of a third codeword with the last U symbols of said second codeword;

means for shortening the initial first codeword received in said stream of codewords by discarding the first U symbols of said initial first codeword;

wherein L and U are positive integers;

a receiver adapted to demodulate said receive signal in accordance with said modulation scheme so as to generate a receive data signal therefrom, said receiver comprising a de-interleaver for de-interleaving a stream of symbols, said de-interleaver comprising:

means for sequentially counting each received symbol;

means for de-interleaving the first L symbols and for extracting L-U symbols therefrom so as to constrict a first shortened codeword;

means for de-interleaving subsequent groups of L symbols and for extracting L symbols from the previously received group of 2L symbols so as to construct subsequent codewords;

a media access control (MAC) circuit adapted to interface an application processor to said shared communications media;

said application processor adapted to control the operation of said transmitter, receiver and MAC and to provide an interface between said MAC and an external host.

38. The modem according to claim 37, wherein said modulation scheme comprises code shift keying (CSK) modulation.

39. The modem according to claim 37, wherein said codeword length has a length L equal to 9 and comprises 7 data symbols and 2 parity symbols.

40. The modem according to claim 37, wherein U is equal to 4.

41. The modem according to claim 37, wherein said codeword length has a length L equal to 7 and comprises 5 data symbols and 2 parity symbols.

42. The modem according to claim 37, wherein U is equal to 1.

43. The modem according to claim 37 adapted to be implemented in an Application Specific Integrated Circuit (ASIC).

44. The modem according to claim 37 adapted to be implemented in a Field Programmable Gate Array (FPGA).

* * * * *